US012349375B2

(12) United States Patent
Holt et al.

(10) Patent No.: US 12,349,375 B2
(45) Date of Patent: Jul. 1, 2025

(54) LATERAL BIPOLAR TRANSISTORS WITH GATE STRUCTURE ALIGNED TO EXTRINSIC BASE (71) Applicant: GLOBALFOUNDRIES U.S. Inc., Malta, NY (US)

(72) Inventors: Judson R. Holt, Ballston Lake, NY (US); Vibhor Jain, Williston, VT (US); Alexander M. Derrickson, Saratoga Springs, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 18/438,882

(22) Filed: Feb. 12, 2024

(65) Prior Publication Data
US 2024/0250158 A1   Jul. 25, 2024

Related U.S. Application Data (62) Division of application No. 17/533,882, filed on Nov. 23, 2021, now Pat. No. 11,949,004.
(Continued)

(51) Int. Cl.
H10D 12/00 (2025.01)
H10D 12/01 (2025.01)
H10D 62/10 (2025.01)

(52) U.S. Cl.
CPC .......... *H10D 12/411* (2025.01); *H10D 12/01* (2025.01); *H10D 62/115* (2025.01)

(58) Field of Classification Search
CPC ....... H01L 29/04; H01L 29/0804–0834; H01L 29/1004; H01L 29/1008; H01L 29/0649; H01L 29/0696; H01L 29/41708; H01L 29/42304; H01L 29/66234–66348; H01L 29/66265; H01L 29/66295–66303; H01L 29/66325; H01L 29/66333–66348; H01L 29/66287; H01L 29/66242; H01L 29/73–7378; H01L 29/732; H01L 29/735; H01L 29/737; H01L 29/739–7398; H01L 29/7325; H01L 29/0817; H01L 29/7375;
(Continued)

(56) References Cited

U.S. PATENT DOCUMENTS 6,551,869 B1   4/2003   Chai et al.
6,586,441 B2   7/2003   Borroni et al.
(Continued)

FOREIGN PATENT DOCUMENTS

JP     H0677559     3/1994

OTHER PUBLICATIONS

Merckel et al., Multifunctional electronic component, Mar. 18, 1994, machine translation of JP H0677559 A, pp. 1-5. (Year: 1994).

*Primary Examiner* — Natalia A Gondarenko
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a lateral bipolar transistor and methods of manufacture. The structure includes: an extrinsic base region; an emitter region on a first side of the extrinsic base region; a collector region on a second side of the extrinsic base region; and a gate structure comprising a gate oxide and a gate control in a same channel region as the extrinsic base region.

18 Claims, 6 Drawing Sheets

Related U.S. Application Data (60) Provisional application No. 63/237,779, filed on Aug. 27, 2021.

(58) Field of Classification Search
CPC ... H01L 29/7393–7395; H01L 29/7397; H01L 27/0229–0244; H01L 27/0262; H01L 27/0263; H01L 27/082–0828; H01L 27/102; H01L 27/1022; H01L 27/11801; H01L 27/11896; H01L 27/2445; H01L 21/04; H01L 21/331; H01L 21/8222; H01L 21/8229; H01L 21/8249; H01L 2924/1305; H01L 2924/13056; H01L 29/1095; H01L 29/42356; H01L 29/1079; H10D 12/031; H10D 12/035; H10D 12/038; H10D 12/411; H10D 12/461; H10D 12/491; H10D 12/01; H10D 64/231; H10D 64/281; H10D 64/512; H10D 62/115; H10D 62/133; H10D 62/134; H10D 62/137; H10D 62/145; H10D 62/177; H10D 62/184; H10D 62/364; H10D 62/393

USPC ........ 257/139, 423, 183, 197, 526, 575, 350
See application file for complete search history.

(56) References Cited

U.S. PATENT DOCUMENTS

| | | | |
|---|---|---|---|
| 6,949,764 | B2 | 9/2005 | Ning |
| 7,375,410 | B2* | 5/2008 | Ho ................ H01L 29/7317 257/E29.183 |
| 8,420,493 | B2 | 4/2013 | Ning et al. |
| 8,441,084 | B2 | 5/2013 | Cai et al. |
| 8,586,441 | B1 | 11/2013 | Cai et al. |
| 9,502,504 | B2 | 11/2016 | Cai et al. |
| 9,536,788 | B1 | 1/2017 | Ning et al. |
| 9,761,664 | B1* | 9/2017 | Gao ................ H01L 29/1008 |
| 9,812,370 | B2 | 11/2017 | Chang et al. |
| 10,367,068 | B2 | 7/2019 | Athanasiou et al. |
| 10,483,368 | B1 | 11/2019 | Hashemi et al. |
| 10,825,921 | B2 | 11/2020 | Balakrishnan et al. |
| 11,063,141 | B1 | 7/2021 | Chen |
| 2014/0239451 | A1 | 8/2014 | Ito et al. |
| 2014/0367745 | A1 | 12/2014 | Cheng et al. |
| 2015/0236093 | A1 | 8/2015 | Chan et al. |
| 2023/0062194 | A1 | 3/2023 | Holt et al. |

* cited by examiner

LATERAL BIPOLAR TRANSISTORS WITH GATE STRUCTURE ALIGNED TO EXTRINSIC BASE

BACKGROUND

The present disclosure relates to semiconductor structures and, more particularly, to lateral bipolar transistors and methods of manufacture.

Bipolar transistors can be vertical transistors or lateral transistors. In a vertical bipolar transistor, carriers flow in a vertical direction. Since a collector region is formed in a position deep from a wafer surface, collector resistance increases, thus limiting the transistor performance especially for high-speed operation. In addition, the transistor requires a high-concentration buried layer, a collector epitaxial layer, and a deep trench isolation, etc. Consequently, the number of process steps increases and thus does the costs. On the other hand, the lateral bipolar transistor is simpler in structure than the vertical bipolar transistor. Also, in a lateral bipolar transistor, a collector electrode can be directly brought into contact with a collector region, which is advantageous for high-speed operation.

SUMMARY

In an aspect of the disclosure, a structure comprises: an extrinsic base region comprising semiconductor material; an emitter region on a first side of the extrinsic base region; a collector region on a second side of the extrinsic base region; and a gate structure comprising a gate oxide and a gate control in a same channel region as the extrinsic base region.

In an aspect of the disclosure, a structure comprises: an extrinsic base region comprising semiconductor material of a first dopant type; an emitter region comprising epitaxial semiconductor material on a first side of the extrinsic base region; a collector region comprising the epitaxial semiconductor material on a second side of the extrinsic base region; a gate structure comprising a gate dielectric material and a gate control, the gate dielectric material, the gate control and the extrinsic base region being in alignment with one another; and an extrinsic base contact comprising the semiconductor material of the first dopant type, and separated from the emitter region, the collector region and the gate structure by insulator material.

In an aspect of the disclosure, a method comprises: forming an extrinsic base region; forming an emitter region on a first side of the extrinsic base region; forming a collector region on a second side of the extrinsic base region; and forming a gate structure comprising a gate oxide and a gate control in a same channel region as the extrinsic base region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to lateral bipolar transistors and methods of manufacture. More specifically, the present disclosure relates to lateral bipolar transistors with a gate structure within the extrinsic base region. In embodiments, the gate structure comprises a CMOS gate contact arranged opposite to the extrinsic base region of a lateral heterojunction bipolar transistor. The gate structure comprises a dielectric material and a gate control, with the extrinsic base sharing a common channel region with the dielectric material and the gate control. Advantageously, the lateral bipolar transistors provide for high voltage RF device applications (e.g., low noise amplifiers and power amplifiers). Also, by using the gate contact, it is now possible to increase controllability in the bipolar mode. The lateral bipolar transistor may also be used for applications in the millimeter waveband, e.g., 28 Gigahertz and higher; although other applications are also contemplated herein.

In embodiments, the lateral bipolar transistors may be lateral heterojunction bipolar transistors. The lateral heterojunction bipolar transistors may be PNP devices or NPN devices. The lateral bipolar transistors can be utilized in either CMOS-only mode (active gate control) or BJT-only mode (isolated gate), or in a mixed mode where both the CMOS and the BJT are active at the same time. The latter mode will result in a complex mix that allows for significantly more information processed per switching cycle, while retaining the broad outlines of CMOS functioning. Also, it is possible to provide a tradeoff between Ft and Fmax in real time.

The lateral bipolar transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the lateral bipolar transistor of the present disclosure have been adopted from integrated circuit (IC) technology. For example, the structures are built on wafers and are realized in films of material patterned by photolithographic processes on the top of a wafer. In particular, the fabrication of the lateral bipolar transistors uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants as is known in the art.

Figure 1:
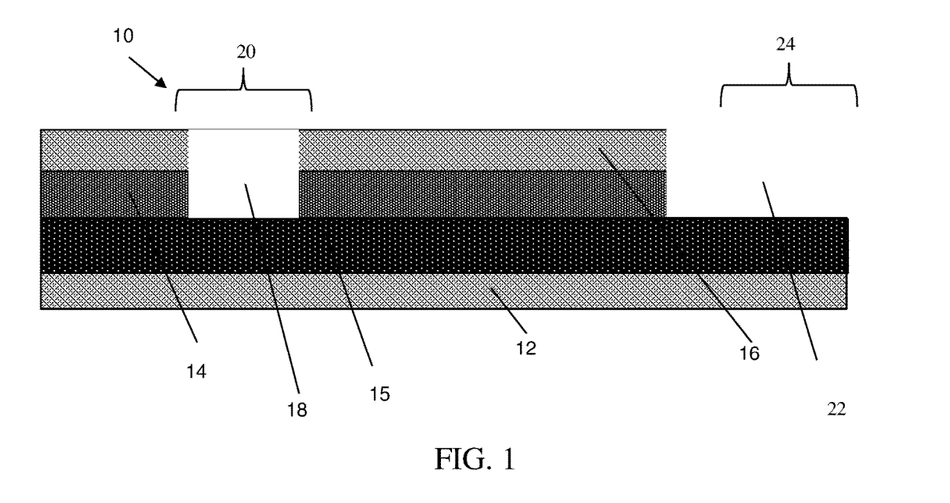
FIG. 1 shows substrate materials, amongst other features, and respective fabrication processes in accordance with aspects of the present disclosure.

FIG. 1 shows substrate materials, amongst other features, and respective fabrication processes. In particular, the structure 10 of FIG. 1 includes a semiconductor substrate 12 with a well 15. The semiconductor substrate 12 may be composed of any suitable semiconductor material including, but not limited to, Si, SiC, GaAs, InAs, InP, and other III/V or II/VI compound semiconductors. In embodiments, the semiconductor substrate 12 may be include n-type isolation structure between the substrate and extrinsic base for an NPN device implementation. Alternatively, the semiconductor substrate 12 may be a p-type substrate with an n-well 15 for a PNP device implementation.

In either embodiment, the well 15 may be formed by conventional ion implantation processes. By way of example, a p-well may be formed using p-type dopants, e.g., boron; whereas an n-well may be formed using n-type dopants, e.g., arsenic, phosphorous, Sb, etc. It should be understood that the well 15 may be formed prior to or after semiconductor material 14 is formed over the semiconductor substrate 12.

The semiconductor material 14 may be SiGe material epitaxially grown on the semiconductor substrate 12 using known epitaxial growth processes such that no further explanation is required for a complete understanding of the present disclosure. An additional semiconductor material 16 may be formed on the semiconductor material 14. The semiconductor material 16 may be a Si material, which is epitaxially grown on the semiconductor material 14. Alternatively, the semiconductor material 16 may be SiC, GaAs, InAs, InP, and other III/V or II/VI compound semiconductors or other semiconductor materials different than semiconductor material 14 in order to form a heterojunction bipolar transistor.

Still referring to FIG. 1, trenches 18, 22 are formed in the semiconductor materials 14, 16. For example, the trenches 18 may be formed in an extrinsic base region 20 and the trenches 22 may be formed in an extrinsic base contact region 24. The trenches 18, 22 may be formed by conventional lithography and etching processes known to those of skill in the art. For example, a resist formed over the semiconductor material 16 is exposed to energy (light) to form a pattern (opening). An etching process with a selective chemistry, e.g., reactive ion etching (RIE), will be used to form a pattern, e.g., trenches 18, 22, exposing a surface of the well 15 in the semiconductor substrate 12. Following the etching process, the resist may be removed by a conventional oxygen ashing process or other known stripants.

Figure 2:
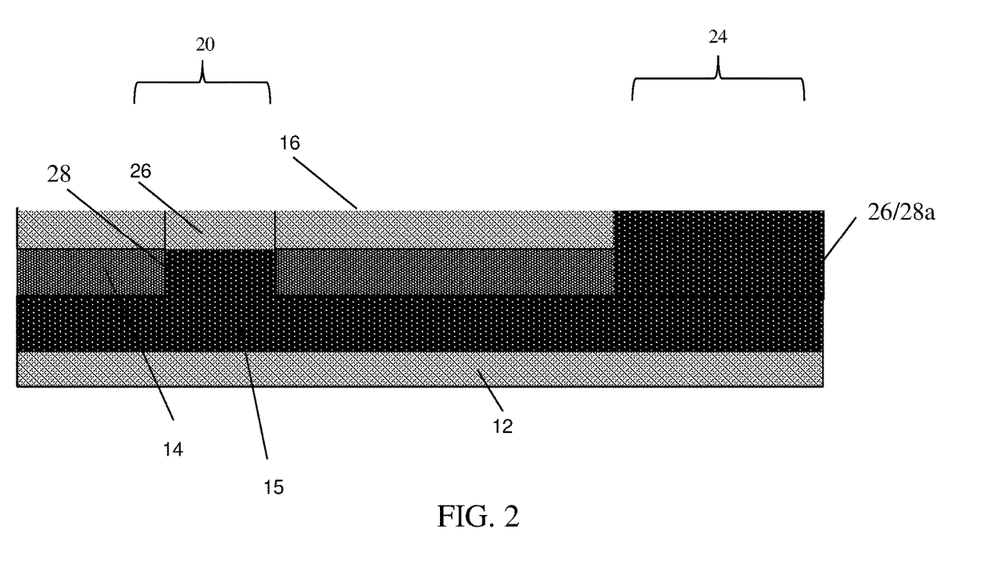
FIG. 2 shows epitaxial semiconductor material within trenches in an extrinsic base region and extrinsic base contact region, amongst other features, and respective fabrication processes.

FIG. 2 shows semiconductor material 26 within the trenches 18, 22. In embodiments, the semiconductor material 26 may be epitaxial semiconductor material grown in the trenches 18, 22 using conventional epitaxial growth processes as is known in the art. The semiconductor material 26 may be doped with P-type dopants, e.g., boron, which will form the extrinsic base 28 (e.g., buried extrinsic base) in the extrinsic base region 20 and a contact 28a in the extrinsic base contact region 24. The p-type dopants may be used for an NPN device. Alternatively, the doping may be an N-type dopant used in a PNP device, as should be understood by those of skill in the art. In either scenario, the doping may be performed by an in-situ doping process or an ion implantation process as is known in the art.

In using the example of a P-type doping, the P-type dopant in the extrinsic base region 20 will extend to and contact the p-well 15 and extend upwards to approximately an upper surface of the semiconductor material 14 to form an extrinsic base 28; whereas the P-type dopant in the extrinsic base contact region 24 will extend to and contact the p-well 20 and extend upwards to an upper surface of the semiconductor material 16 to form an extrinsic base contact 28a. The remaining undoped material 26 in the extrinsic base region 20 may act as an intrinsic base.

Figure 3:
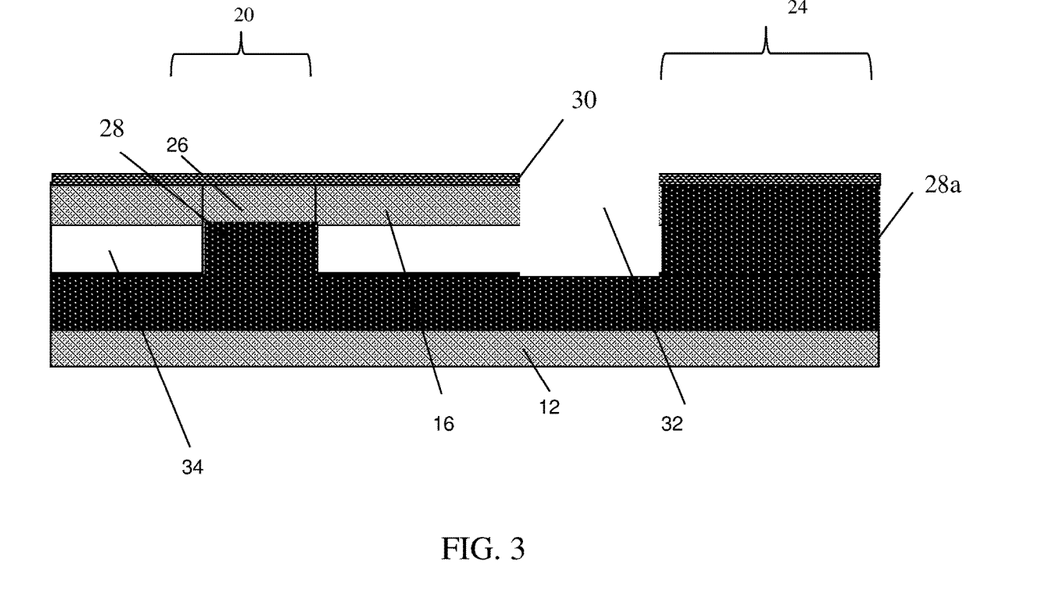
FIG. 3 shows a trench and cavity in the substrate materials, amongst other features, and respective fabrication processes.

In FIG. 3, a mask layer 30 may be provided over the semiconductor material 16, amongst other structures. In embodiments, the mask layer 30 may be a nitride hardmask deposited using conventional deposition processes, e.g., CVD. A trench 32 and cavity 34 may be formed in the structure using conventional etching processes selective to the semiconductor materials 14, 16. For example, an opening is formed in the capping layer 30, with etching chemistries selective to the semiconductor material 16 to form the trench 32 and etching chemistries selective to the semiconductor material 14 to form the cavity 34. In the latter process, the semiconductor material 14 can be removed from underneath the semiconductor material 16 to form the cavity 34.

Figure 4:
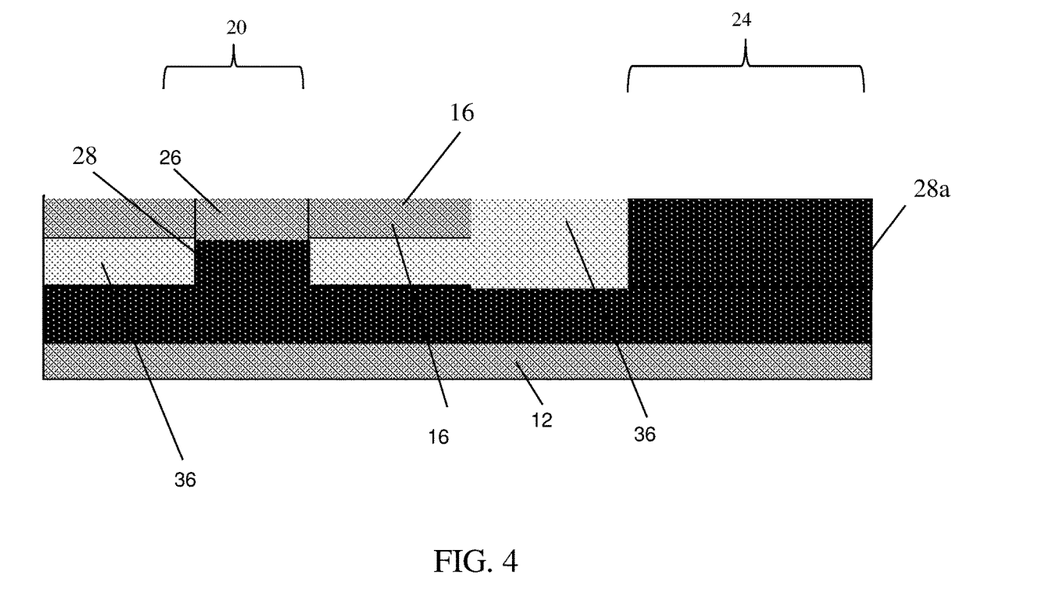
FIG. 4 shows the trench and the cavity filled with insulator material, amongst other features, and respective fabrication processes.

As shown in FIG. 4, insulator material 36 fills the cavity 34 and the trench 32. In embodiments, the insulator material 36 may be a flowable oxide or spin-on-glass as two illustrative, non-limiting examples. The insulator material 36 within the trench 32 will effectively form a shallow trench isolation region, which isolates the extrinsic base contact 28a from the remaining portions of the device, e.g., collector, emitter, extrinsic base, and gate control. A chemical mechanical polishing step may be used to remove any excess insulator material from the surface of the structure. The mask layer 30 may be stripped using conventional etching processes. In this way, the semiconductor material 16 may effectively be semiconductor on insulator technology, e.g., substrate 12, insulator material 36 and semiconductor material 16.

Figure 5:
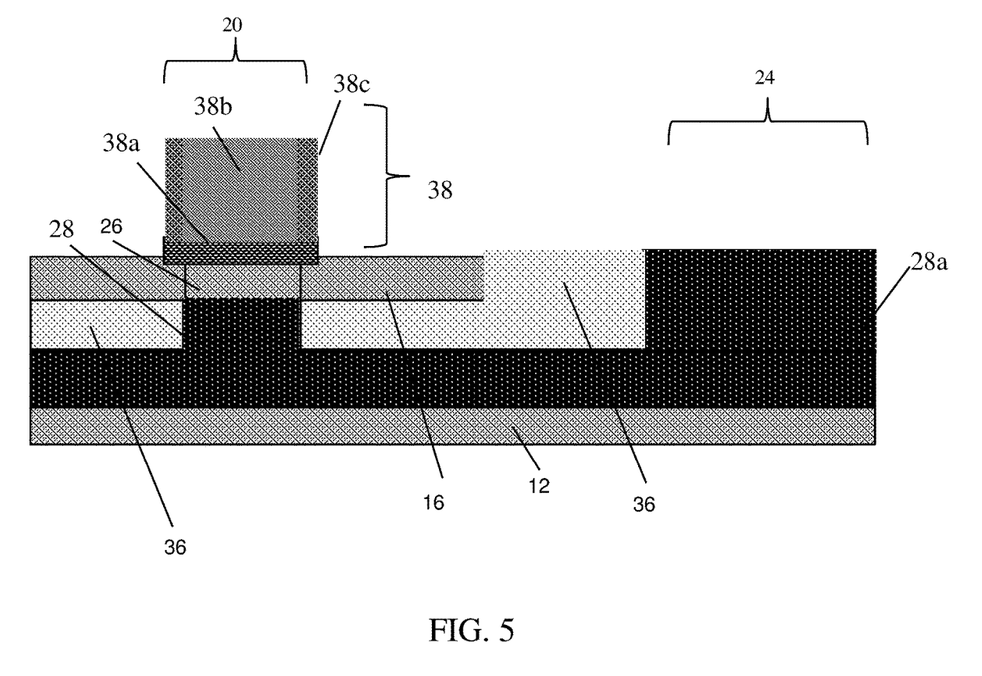
FIG. 5 shows a gate structure in the extrinsic base region, amongst other features, and respective fabrication processes.

In FIG. 5, a gate structure 38 may be formed in the extrinsic base region 20, over and in alignment with the intrinsic base 26 and the extrinsic base 28. In embodiments, the gate structure 38 comprises a gate dielectric material 38a, a gate body 38b (e.g., gate control) and sidewall spacers 38c. In embodiments, the gate dielectric material 38a may be a low-k material, e.g., oxide, or a high-k material, e.g., hafnium based material. The gate body 38b may be a polysilicon material, work function metal(s) with a polysilicon material or metal materials, depending on processes used to form the gate structure 38. The sidewall spacers 38c may be oxide or nitride or a combination thereof. The gate structure 38 may have a width equal to, greater than or less than the width of the extrinsic base 28. Also, it should be understood that the extrinsic base 28, the gate dielectric material 38a and the gate body 38b, e.g., gate control, share a common channel region. In this way, it is possible to provide many of the advantages of the present disclosure as described herein.

The gate structure 38 may be fabricated using conventional CMOS processes. For example, the gate structure 38 can be fabricated using standard CMOS or replacement gate processes. In the standard CMOS processing, the gate dielectric material 38a and polysilicon (gate body 38b) are formed, e.g., deposited, on the semiconductor material 16, followed a patterning process. An insulator material such as nitride or oxide can be deposited on the patterned materials, followed by an anisotropic etching process to form the sidewalls 38c.

Figure 6:
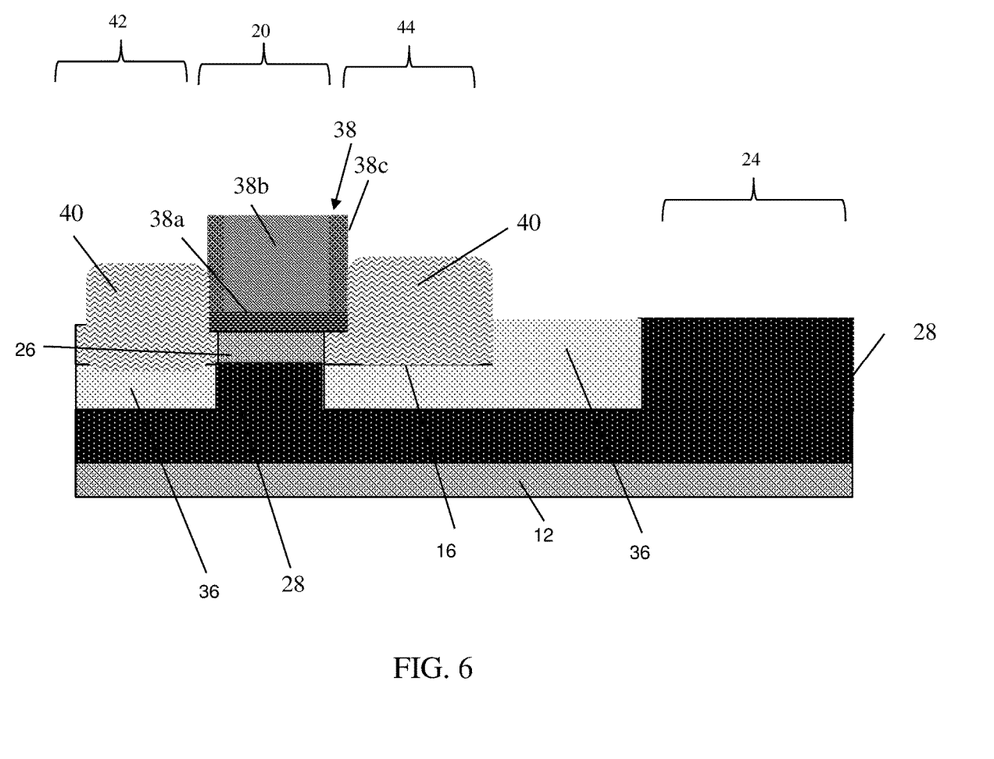
FIG. 6 shows an epitaxial semiconductor material in an emitter region and a collector region, amongst other features, and respective fabrication processes.

FIG. 6 shows an epitaxial semiconductor material 40 in the emitter region 42 and the collector region 44 on opposing sides of the extrinsic base region 20, e.g., gate structure 38.

The epitaxial semiconductor material 40 in the collector region 44 may be isolated from the extrinsic base contact 28a by the insulator material 36, e.g., shallow trench isolation structure. In embodiments, the epitaxial semiconductor material 40 in the emitter region 17 and the collector region 19 may be an N+ doped Si material. The N+ doping may occur in-situ during the epitaxial growth process. The N+ dopants may be, e.g., arsenic, phosphorous, etc. (The epitaxial semiconductor material 40 may be P+ doped for a PNP configuration.) The dopants can be driven into the semiconductor material 16 by a rapid thermal anneal process as is known in the art. In embodiments, the epitaxial semiconductor material 40 may form a raised emitter and a raised collector, isolated from the gate structure 38 by the sidewall spacers 38c.

In alternative embodiments, the epitaxial semiconductor material 40 may be formed by an emitter and collector etching process which opens a trench into the semiconductor material 16, followed by an in-situ doped epitaxial growth process. In embodiments, the emitter and collector etching process may be a conventional lithography and etching process as already described herein such that no further explanation is required for a complete understanding of the present disclosure. This process may be used to form a planar emitter and collector or, alternatively, a raised emitter and collector.

As still another alternative embodiment, the emitter region 42 and the collector region 44 may be formed by conventional ion implantation processes known to those of skill in the art. For example, an N-well implant region may be formed using n-type dopants implanted within the semiconductor material 16. The n-type dopants may be, e.g., Arsenic (As), Phosphorus (P), among other suitable examples. In embodiments, a patterned implantation mask may be used to define selected areas exposed for the implantations. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions.

Figure 7:
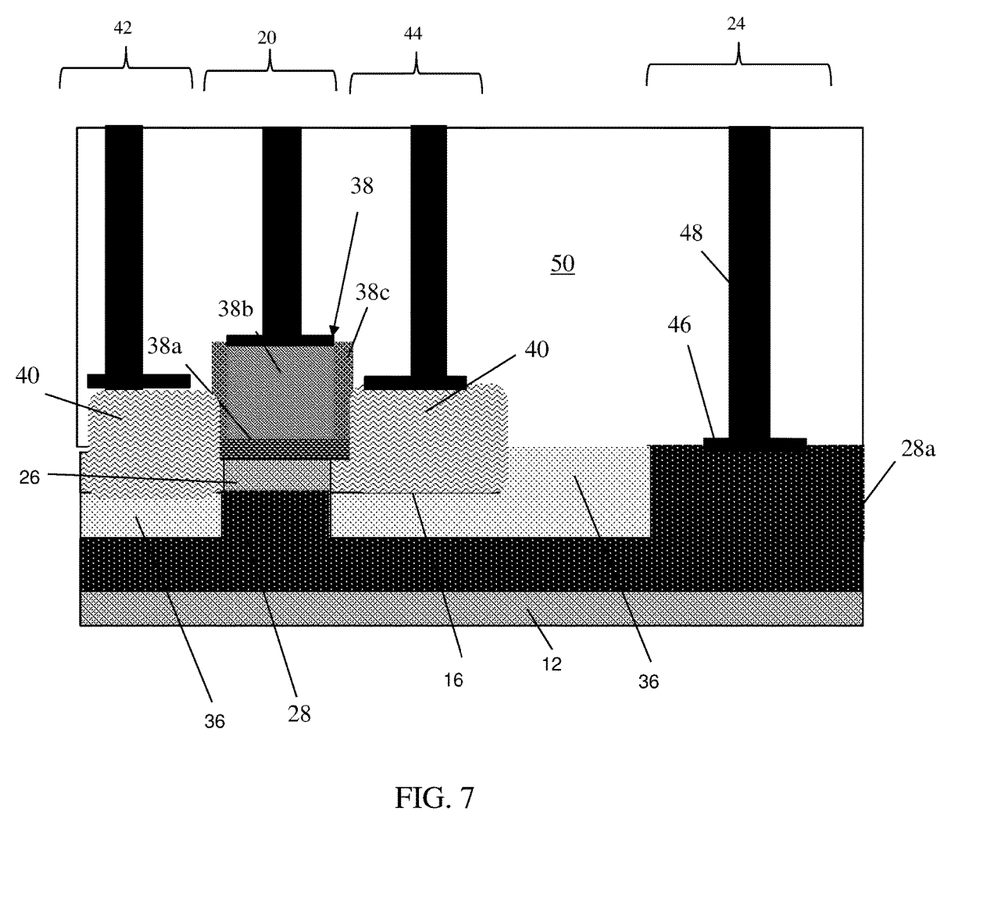
FIG. 7 shows contacts to the extrinsic contact base region, the emitter region, the collector region, and the gate structure, amongst other features, and respective fabrication processes.

In FIG. 7, contacts 48 are formed to the gate structure 38, the semiconductor material 40 in the emitter region 42 and the collector region 44, and the extrinsic base contact 28a. Prior to the deposition of the conductive material for the contact, a silicide 46 (e.g., NiSi) may be formed on the exposed semiconductor material of the gate structure 38, the semiconductor material 40 in the emitter region 42 and the collector region 44, and the extrinsic base contact 28a.

As should be understood by those of skill in the art, the silicide process begins with deposition of a thin transition metal layer, e.g., nickel, cobalt or titanium, over the semiconductor materials. After deposition of the material, the structure is heated allowing the transition metal to react with exposed semiconductor material forming a low-resistance transition metal silicide, e.g., NiSi. Following the reaction, any remaining transition metal is removed by chemical etching, leaving silicide contacts 46.

The contacts 48, e.g., conductive material, may be deposited on the silicide contacts 46 within vias formed in interlevel dielectric material 50. The vias may be formed by conventional lithography and etching processes. A conductive material, e.g., tungsten or aluminum with a liner material, e.g., TiN, may be deposited within the vias to form the contacts 48. Any residual material on the interlevel dielectric material 50 may be removed by a CMP process.

Figure 8:
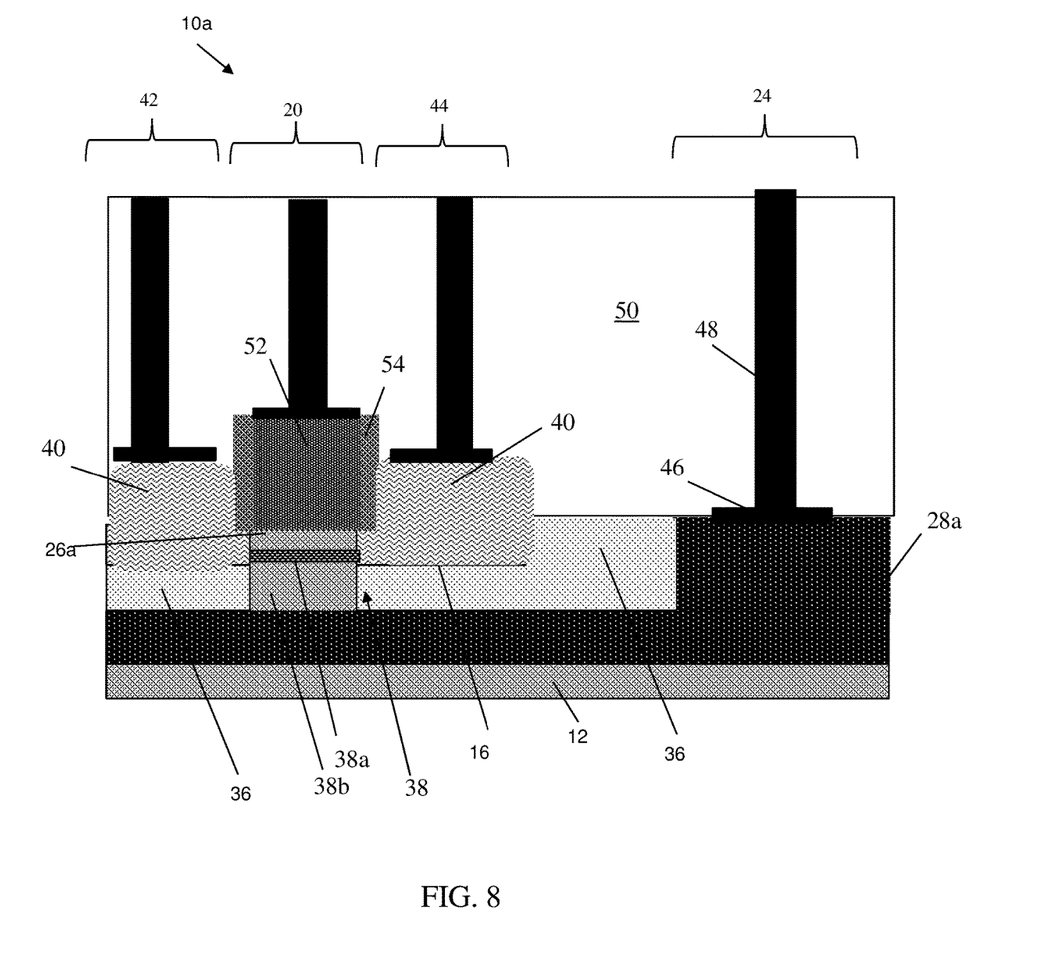
FIG. 8 shows an alternative structure and respective fabrication processes.

FIG. 8 shows an alternative structure 10a and respective fabrication processes. In this structure 10a, the extrinsic base 52 is a raised extrinsic base and the gate structure 38 is below the extrinsic base 52. As described further, the gate structure 38 is buried in the substrate, and isolated therefrom by insulator material 36. Also, as in the previous embodiment, the gate dielectric material 28, the gate control (e.g., gate body 38b) and the extrinsic base 52 share a common channel region.

In embodiments, the gate structure 38 may be fabricated by an epitaxial semiconductor material growth process within a trench formed between shallow trench isolation structures, e.g., insulator material 36. In this fabrication process, for example, the insulator material 36 may be deposited within the cavity and trench, followed by a trench formation to expose portions of the insulator material 36. A semiconductor material (e.g., gate body 38b) may be epitaxially grown in the trench, on exposed sidewalls of the insulator material. In this way, polysilicon forms within the trench acting as the gate body 38b. A gate dielectric material 38a may be formed over the gate body 38n using conventional deposition and patterning process.

An undoped semiconductor material 26a may be deposited on the gate dielectric material 38a. In embodiments, the semiconductor material 26a may be Si material, which acts as an intrinsic base. The extrinsic base 52 may be formed over the semiconductor material 26a. The extrinsic base 52 may be formed by a P+ doped in-situ epitaxial growth process as is known in the art and discussed herein. The semiconductor material of the extrinsic base 52 may be SiGe material, which is patterned using conventional lithography and etching processes as already described herein. A sidewall spacer 54, e.g., nitride and/or oxide, is formed on the sidewalls of the patterned SiGe material. The semiconductor material 40 in the emitter region 42 and collector region 42, and the contacts 48 are formed as described with respect to FIGS. 6 and 7.

The transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
an extrinsic base region;
an emitter region on a first side of the extrinsic base region;
a collector region on a second side of the extrinsic base region; and
a gate structure comprising a gate dielectric material and a gate control in a same channel region as the extrinsic base region,
wherein the gate structure is below the collector region and the emitter region, and the extrinsic base region is above the gate structure, and
wherein the gate control comprises a gate body isolated from semiconductor substrate material by shallow trench isolation structures and insulator material that fills a cavity surrounding sides of the gate body and underneath the collector region and the emitter region, and further comprising a well within a semiconductor substrate underneath the insulator material and contacting both an extrinsic base contact on a side of the insulator material and a bottom surface of the gate body.

2. The structure of claim 1, wherein the gate dielectric material is above the gate body, and an intrinsic base region is above the gate dielectric material and below the extrinsic base region.

3. The structure of claim 1, wherein the extrinsic base region comprises P+ semiconductor material, and further comprises sidewall spacers that isolate the P+ semiconductor material from the emitter region and the collector region.

4. The structure of claim 3, wherein the emitter region and the collector region comprise epitaxial semiconductor material which are raised epitaxial regions with respect to a top surface of insulator material adjacent to and extending underneath the emitter region and the collector region.

5. The structure of claim 4, wherein the epitaxial semiconductor material is raised above a semiconductor substrate.

6. The structure of claim 5, further comprising insulator material in a cavity of a semiconductor substrate, the insulator material surrounding the extrinsic base region and underneath both the emitter region and the collector region.

7. The structure of claim 6, wherein the gate structure is buried in the semiconductor substrate and isolated by the insulator material.

8. The structure of claim 4, wherein the epitaxial semiconductor material is on sides of the gate structure.

9. The structure of claim 5, wherein the gate control is a gate body which comprises polysilicon material.

10. The structure of claim 1, further comprising an intrinsic base region which comprises undoped semiconductor material and the extrinsic base region comprises doped semiconductor material.

11. The structure of claim 1, further comprising sidewall spacers on sidewalls of the extrinsic base region.

12. The structure of claim 11, wherein the sidewall spacers separate the extrinsic base region from the emitter region and the collector region.

13. A structure comprising:
an extrinsic base region comprising semiconductor material of a first dopant type;
an emitter region comprising epitaxial semiconductor material on a first side of the extrinsic base region;
a collector region comprising the epitaxial semiconductor material on a second side of the extrinsic base region;
a gate structure comprising a gate dielectric material and a gate control, the gate dielectric material, the gate control and the extrinsic base region being in alignment with one another;
an extrinsic base contact comprising the semiconductor material of the first dopant type, and separated from the emitter region, the collector region and the gate structure by insulator material;
insulator material surrounding sides of the gate control of the gate structure; and
a well underneath the gate structure and directly contacting both the extrinsic base contact and a bottom surface of the gate control of the gate structure, the well extending underneath the insulator material,
wherein the extrinsic base region is raised extrinsic base region above the gate structure, and the gate structure is buried in a substrate material.

14. The structure of claim 13, wherein the extrinsic base region includes sidewall spacers isolating the extrinsic base region from the raised collector region and the raised emitter region.

15. The structure of claim 13, further comprising insulator material surrounding the gate structure.

16. A method comprising:
forming an extrinsic base region;
forming an emitter region on a first side of the extrinsic base region;
forming a collector region on a second side of the extrinsic base region; and
forming insulator material in a cavity structure under the emitter region and the collector region;
forming an extrinsic base contact wrapping around a semiconductor material of the extrinsic base region and adjacent to the insulator material, the extrinsic base contact contacting a well formed in the semiconductor material under the insulator material and which contacts an underside of a gate structure,
wherein the gate structure is below the collector region and the emitter region and is surrounded on its sides by the insulator material, and the extrinsic base region is above the gate structure.

17. The structure of claim 1, wherein the well contacts to an underside of the gate control of the gate structure and to an extrinsic base contact.

18. The structure of claim 17, wherein the gate control is a polysilicon material and the gate dielectric material is a high-k gate dielectric material.

* * * * *